United States Patent [19]

Kubo et al.

[11] Patent Number: 5,093,922
[45] Date of Patent: Mar. 3, 1992

[54] RECEIVING APPARATUS FOR RECEIVING A BS-IF SIGNAL CONVERTED INTO A SUPERHIGH BAND OR UHF BAND

[75] Inventors: Kazuhiko Kubo, Osaka; Akira Usui; Minoru Ueda, both of Takatsuki, all of Japan

[73] Assignee: Matsushita Electric Industrial Co., Ltd., Osaka, Japan

[21] Appl. No.: 381,732

[22] PCT Filed: Nov. 29, 1988

[86] PCT No.: PCT/JP88/01203
§ 371 Date: Jul. 18, 1989
§ 102(e) Date: Jul. 18, 1989

[87] PCT Pub. No.: WO89/05548
PCT Pub. Date: Jun. 15, 1989

[30] Foreign Application Priority Data

Nov. 30, 1987 [JP] Japan .................. 62-302356

[51] Int. Cl.$^5$ .............................. H04N 1/00
[52] U.S. Cl. ....,....................... 455/6; 455/189; 455/315
[58] Field of Search ............ 455/3, 6, 314, 315, 455/323, 188, 189, 190, 131; 358/86

[56] References Cited

U.S. PATENT DOCUMENTS

| | | | |
|---|---|---|---|
| 4,079,415 | 3/1978 | Will | 455/3 |
| 4,418,427 | 11/1983 | Muterspaugh | 455/188 |
| 4,633,513 | 12/1986 | Taney | 455/190 |

OTHER PUBLICATIONS

CATV of Satellite Broadcasting Age, CATV Technical Research Meeting, GYOSEI, pp. 50-52, Jul. 10, 1987—English translation of relevant portions.

Primary Examiner—Curtis Kuntz
Assistant Examiner—Edward Urban
Attorney, Agent, or Firm—Stevens, Davis, Miller & Mosher

[57] ABSTRACT

The present invention relates to a receiving apparatus which can be used in receiving a satellite broadcast by using a cable television system. The receiving apparatus uses a double-super type converter or tuner (2) having a first frequency-conversion portion (15) and a second frequency-conversion portion (19). A conversion output terminal (G) for feeding a signal to a BS tuner (5) is provided at the output side of the first frequency-conversion portion (15). A BA signal converted into a UHF band or a superhigh band is fed to the first frequency-conversion portion (15) through a cable, so that, after frequency conversion, a BS-IF signal is taken out from the conversion output terminal (G). Thus, the BS-IF signal can be fed to the BS tuner (5) without using any special up-converter.

2 Claims, 2 Drawing Sheets

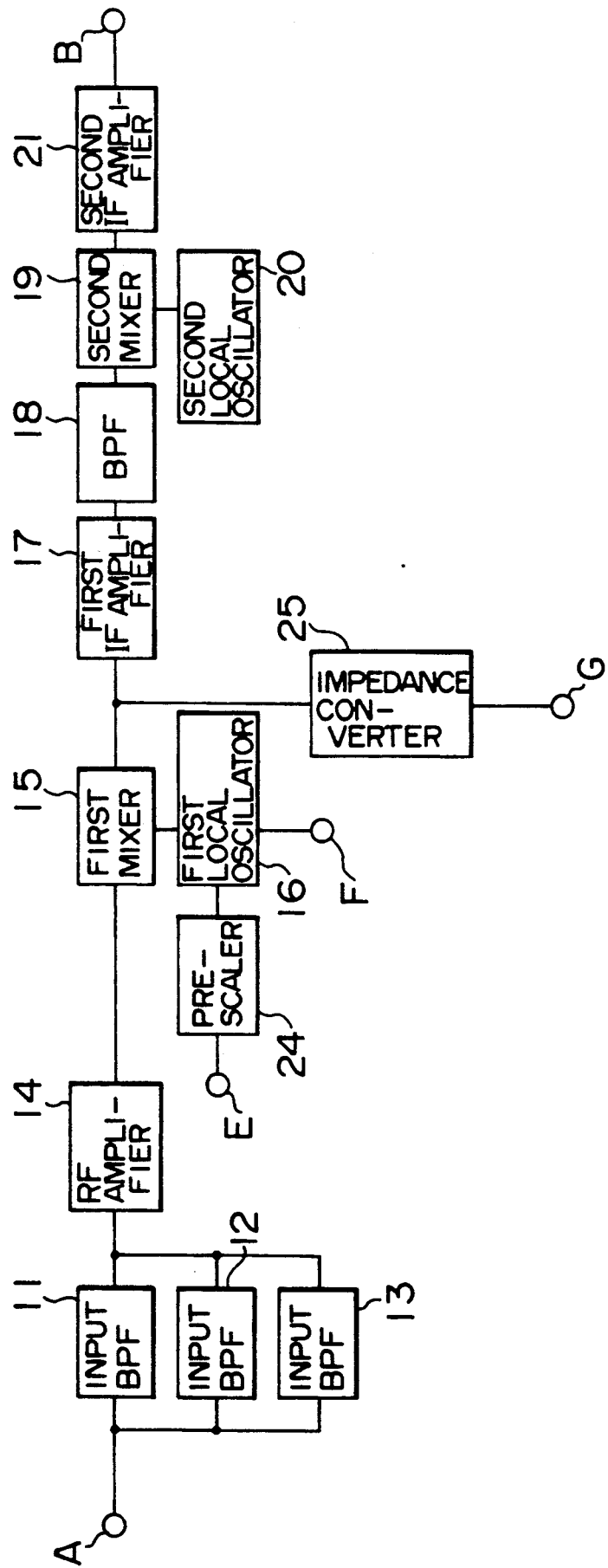
F I G. 3

RECEIVING APPARATUS FOR RECEIVING A BS-IF SIGNAL CONVERTED INTO A SUPERHIGH BAND OR UHF BAND

TECHNICAL FIELD

The present invention relates to receiving apparatus, such as CATV converters, televison tuners, and the like, for receiving satellite broadcasting programs transmitted through cables.

BACKGROUND ART

Satellite broadcasting, CATV, and the like, have been popularized with the rise of new media in recent years. In order to receive a satellite broadcast, it is popular to use a system in which a parabolic antenna is arranged in every home. A received signal, for example, of 4 GHz band is converted by a frequency converter called a "BS converter" into an intermediate-frequency signal (BS-IF signal) in a band of from 1.0 GHz to 1.3 GHz, and the intermediate-frequency signal is led indoors so as to be received by a BS tuner. Transmission of satellite broadcasting FM signals by using a superhigh band or a UHF band among television bands in the rate of several channels per BS channel has been put into practical use with the development of CATV. In order to achieve reception in this case, it is popular to use a receiving system in which a cable signal is converted into a BS-IF signal by using an up-converter and the output of the up-converter is fed to the BS tuner.

Such a conventional receiving apparatus as described above will be described hereunder with reference to FIG. 1.

FIG. 1 shows a conventional system for receiving a satellite broadcast through a cable. In FIG. 1, the reference numeral 1 designates CATV equipment, 21 a CATV converter for converting the frequency of a CATV signal outputted from the CATV equipment 1, 3 a TV set, 4 a BS up-converter for converting the frequency of the CATV signal outputted from the CATV equipment 1, and 5 a BS tuner for feeding the output signal of the BS up-converter to the television set 3.

In the receiving apparatus having such a configuration as described above, the operation of the apparatus will be described hereunder. In FIG. 1, a general 6 MHz-band signal among the cable signals transmitted from the CATV equipment 1 is frequency-converted by the CATV converter 21 into a predetermined RF channel signal which is then fed to the TV set 3. On the other hand, a BS-IF signal converted in the CATV equipment 1 into a superhigh band or a UHF band is frequency-converted by the up-converter 4 into a band of from 1.0 GHz to 1.3 GHz which is then fed to the BS tuner 5. In the BS tuner 5, the signal is converted into a 13th UHF channel signal or outputted as an audio/video signal so as to be inputted into the TV set 3. In the case of an all-band tuner type receiver, the converter 21 can be omitted.

In order to receive the BS-IF signal converted into a superhigh band or a UHF band, however, it is necessary to employ such an additionally provided up-converter 4 as described above, and there has been a problem in that cost increases largely.

It is therefore an object of the present invention to provide a receiving apparatus having no necessity of employing such an additionally provided up-converter also that costs can be greatly reduced.

DISCLOSURE OF THE INVENTION

In order to attain the foregoing object, the receiving apparatus according to the present invention uses a double-super type converter or tuner having a first frequency-conversion portion and a second frequency-conversion portion. A conversion output terminal for feeding a signal to a BS tuner is provided at the output side of the first frequency-conversion portion. A BS signal converted into a UHF band or a superhigh band is fed to the first frequency-conversion portion through a cable so as to be subject to frequency conversion. Then, a BS-IF signal is taken out from the conversion output terminal and fed to the BS tuner without using such an additionally provided up-converter.

In this configuration, an up-conversion function can be established in the inside of the converter or tuner, and there is no necessity of additional provision of such an up-converter. Accordingly, simplification in construction can be attained, so that cost can be reduced largely.

BRIEF DESCRIPTION OF THE DRAWINGS

and FIG. 3 is a block diagram of an important element of FIG. 2.

BEST MODE FOR CARRYING OUT THE INVENTION

An embodiment of the present invention will be described hereunder with reference to the drawings.

Figure 1:
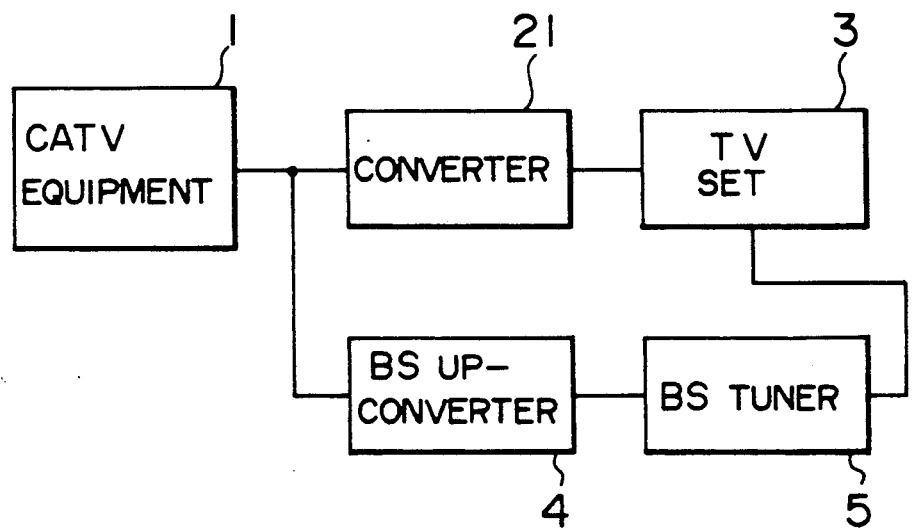
FIG. 1 is a block diagram showing the configuration of a conventional receiving apparatus.
Figure 2:
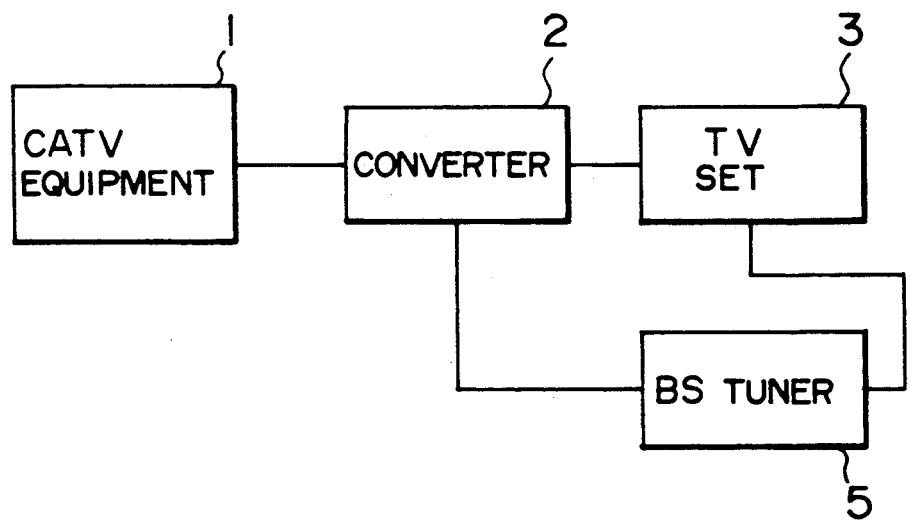
FIG. 2 is a block diagram of an embodiment of the receiving apparatus of the present invention.

FIG. 2 shows the overall configuration of an embodiment of the receiving apparatus according to the present invention. In FIG. 2, the reference numeral 1 designates CATV equipment arranged to output a 6 MHz-band television signal and a BS-IF signal which is obtained by receiving a satellite broadcast and by converting the received satellite broadcast into a superhigh band or a UHF band by use of several channels. The reference numeral 2 designates a double-super type converter which receives the output signal from the CATV equipment 1. The reference numeral 3 designates a television set, and 5 a BS tuner which receives a signal of a band of from 1.0 to 1.3 GHz. In the case where the television set 3 incorporates a CATV-receivable double-super type tuner, the converter 2 can be omitted.

In the receiving apparatus having such a configuration as described above, the operation of the apparatus will be described hereunder. The converter 2 or the CATV-receivable double-super type tuner incorporated in the television set 3 is provided with a conversion output terminal. The BS-IF signal converted into a superhigh band or a UHF band and outputted from the CATV equipment 1 is frequency-converted, by the converter 2 or the CATV-receivable double-super type tuner, into a signal having a frequency of from 1.0 GHz to 1.3 GHz which is in turn fed to the BS tuner 5, so that the thus obtained audio and video signals are fed to respective input terminals of the television set 3.

Next, FIG. 3 will be described. FIG. 3 shows the configuration of the double-super type converter 2 shown in FIG. 2 or the CATV-receivable double-super type tuner portion incorporated in the TV set 3. Although the configuration of the double-super type tuner portion will be illustrated in the following, the converter has the same configuration as the tuner portion basically. In FIG. 3, the reference numerals 11 to 13 designate input BPFs different in pass band from each other, 14 a wide-band RF amplifier, 15 a first mixer, 16 a first variable-frequency local oscillator, 17 a first IF amplifier, 18 a BPF, 19 a second mixer, 20 a second fixed-frequency local oscillator, 21 a second IF amplifier, 24 a prescaler, and 25 an impedance converter.

In the following, the operation of the thus configured tuner portion is described. In FIG. 2, the reference numerals 11, 12 and 13 designate input BPFs provided respectively for various bands (for example, a VHF low-band $V_L$ and mid-band, a VHF high-band $V_H$ and superhigh-band, and a UHF band). The signal received at the terminal A and passed through the BPFs 11, 12 and 13 is amplified by the wide-band RF amplifier 14 and then fed to the first mixer 15. The output signal from the wide-band RF amplifier 14 is mixed with a first local oscillation signal of the first local oscillator in the mixer 15, so that a difference component between the signals is taken out as a first IF signal. The first IF signal is amplified by the first IF amplifier 17, and only the first IF signal is selected through the BPF 18 and fed to the second mixer 19. This first IF signal is mixed with a second local oscillation signal of the second local oscillator 20 in the second mixer 19, so that a difference component between the signals is taken out as a second IF signal, for example, of 58.75 MHz. The second IF signal is passed through the second IF amplifier 22 and outputted as a second IF output signal from the terminal B. A tuning voltage is fed from the terminal F to the first local oscillator 16. The local oscillation signal of the first local oscillator 16 is frequency-divided by the prescaler 24, and the output of the prescaler is fed to a station-selection circuit through the terminal E. The foregoing is the configuration of the double-super type tuner or converter and is a system which is advantageous in multichannel reception and wide-band reception in CATV or the like.

Assuming now the case where a BS-IF signal converted into a UHF band is received at the terminal A, then for example the frequency relationship is as follows.

| CHANNEL | BS-IF FREQUENCY (MHz) | UHF FREQUENCY (MHz) |
|---|---|---|
| BS-1 | 1035.98–1062.98 | 738.52–765.52 |
| BS-15 | 1304.50–1331.50 | 470.0–497.0 |

In short, in this case, an up-converted BS-IF signal can be obtained again as the output signal of the first mixer 15, if the first local oscillation frequency is established to be 1801.5 MHz. Or, in the case where the BS-IF signal is converted into a superhigh band, the local oscillation frequency becomes about 1500 MHz.

On the other hand, when, for example, the frequency of the first IF signal in the double-super tuner for receiving the general VHF low-band, VHF high-band and part of UHF band signals is established to be 950 MHz, the required range of the first local oscillation frequency is from 1040 MHz to 1720 MHz so that the local oscillation frequency necessary for a CATV channel falls always within a predetermined variable range even in the case where the signal is transmitted in either the aforementioned UHF or the superhigh band. Or, in the case where the just local point of the NTSC-method television signal were different from that of the BS-IF signal, the problem could be solved by adding it into a station-selection program.

As described above, the input signal from the terminal A is passed through the filters 12 and 13 in the case of superhigh band and in the case of UHF band, respectively, and fed to the first mixer 15 through the RF amplifier 14 so as to be mixed with the first local oscillation signal in the mixer 15, so that a frequency-converted normal BS-IF signal (from 1.0 GHz to 1.3 GHz) appears as a mixer output. The BS-IF signal is passed through the impedance converter 25 to the terminal G, so that the output from the terminal G is fed to an IF input terminal of the BS tuner 5 through a cable or the like. When the output impedance of the first mixer 15 is about 75 Ω, the impedance converter 25 can be omitted. Further, the sum component appearing at the output of the first mixer 15 does not cause any problem, because the sum component is attenuated by a low-pass filter (not shown) of the BS tuner input portion.

As described above, according to the embodiment of the present invention, it is possible to realize a system capable of receiving a cable-transmitted BS-IF signal by employing a converter 2 of the double-super type or a tuner of the same type and by providing a block conversion output terminal G at the output side of the first mixer 15, but without using any up-converter.

INDUSTRIAL APPLICABILITY

As described above, according to the present invention, the necessity of mounting an up-converter at the outside as in the prior art can be eliminated by using a double-super type converter or tuner for receiving a cable-transmitted BS-IF signal and by providing a conversion output terminal at the output side of the first mixer, so that the configuration can be simplified remarkably and the receiving system can be made inexpensive and small-sized. Thus, the effects in practical use of the invention is large.

We claim:

1. A receiving apparatus comprising:
   an input terminal for receiving an input signal including a BS-IF signal converted into one of a superhigh-band and a UHF-band signal;
   a plurality of band-pass filters for filtering said input signal from said input terminal, said input signal being passed through said band-pass filters band by band;
   a first local oscillator having a variable oscillation frequency and for generating an output signal;
   a first mixer receiving an output signal from one of said band-pass filters and said output signal from said first local oscillator and providing an output signal comprising a first intermediate frequency signal;
   a second local oscillator having a fixed oscillation frequency and for generating an output signal;
   a second mixer receiving an output signal from said first mixer and said output signal from said second local oscillator and providing an output signal comprising a second intermediate frequency signal; and
   an output terminal connected directly to an output end of said first mixer,
   whereby said BS-IF signal converted into the superhigh-band or UHF-band is up-converted and outputted from said output terminal.

2. A receiving apparatus comprising:

an input terminal for receiving an input signal including a BS-IF signal converted into one of a super-high-band and a UHF-band signal;

a plurality of band-pass filters for filtering said input signal from said input terminal, said input signal being passed through said band-pass filters band by band;

a first local oscillator having a variable oscillation frequency and for generating an output signal;

a first mixer receiving an output signal from one of said band-pass filters and said output signal from said first local oscillator and providing an output signal comprising a first intermediate frequency signal;

a second local oscillator having a fixed oscillation frequency and for generating an output signal;

a second mixer receiving an output signal from said first mixer and said output signal from said second local oscillator and providing an output signal comprising a second intermediate frequency signal;

an impedance converter; and an output terminal connected via said impedance converter to an output end of said first mixer, whereby said BS-IF signal converted into the super-high-band or UHF-band is up-converted and outputted from said output terminal.

* * * * *